United States Patent
Liebregts et al.

(10) Patent No.: US 6,870,601 B2
(45) Date of Patent: Mar. 22, 2005

(54) LITHOGRAPHIC APPARATUS AND DEVICE MANUFACTURING METHOD

(75) Inventors: Paulus Martinus Maria Liebregts, Veldhoven (NL); Arno Jan Bleeker, Westerhoven (NL); Erik Roelof Loopstra, Heeze (NL); Harry Borggreve, Waalre (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 10/457,786

(22) Filed: Jun. 10, 2003

(65) Prior Publication Data

US 2004/0041104 A1 Mar. 4, 2004

(30) Foreign Application Priority Data

Jun. 12, 2002 (EP) ............................................. 02254089

(51) Int. Cl.$^7$ ........................... G03B 27/42; G03B 27/54
(52) U.S. Cl. .......................................... 355/53; 355/67
(58) Field of Search .................... 219/121.74; 315/102; 430/5; 355/53, 67, 71

(56) References Cited

U.S. PATENT DOCUMENTS

| | | | |
|---|---|---|---|
| 4,090,189 A | | 5/1978 | Fisler ......................... 340/335 |
| 4,230,408 A | * | 10/1980 | Nigg ............................ 355/35 |
| 4,653,903 A | * | 3/1987 | Torigoe et al. ............... 355/53 |
| 5,290,992 A | | 3/1994 | Lin et al. |
| 6,238,852 B1 | * | 5/2001 | Klosner ....................... 430/396 |
| 2003/0218730 A1 | * | 11/2003 | Murakami et al. ............ 355/53 |

FOREIGN PATENT DOCUMENTS

| | | |
|---|---|---|
| DE | 199 50 135 A1 | 4/2001 |
| EP | 0 507 589 A3 | 10/1992 |
| EP | 0 507 589 A2 | 10/1992 |
| EP | 1 107 064 A2 | 6/2001 |

OTHER PUBLICATIONS

Kassakian, Schlecht, Verghese, "Principles of Power Electronics," 1991, Addison–Wesley Publishing Company (Reading, Massachusetts), Doc. No. XP–002250999 pertinent pp.: 127; pertinent figures: 6.22(a).

Linear Technology Corporation, "LT1932—Final Electrical Specifications; Constant–Current DC/DC LED Driver in ThinSOT," Doc. No. XP–002250997, Jul. 2001; found at Internet address <URL:http:www.linear.com/pdf/1932i.pdf> on Aug. 11, 2003; pertinent pp.: 1, 4, 6, 7; pertinent figures: 1, 5.

Maxim Integrated Products, "MAX1848—White LED Step–Up Converter in SOT23," Doc. No. XP–002250998, May 2001; found at Internet address <URL:http://web.archive.org/web/20010614052210/http://pdfserv.maxim–ic.com/arpdf/MAX1848.pdf> on Aug. 11, 2003; pertinent pp.: 7; pertinent figures: 2.

* cited by examiner

Primary Examiner—Rodney Fuller
(74) Attorney, Agent, or Firm—Pillsbury Winthrop LLP

(57) ABSTRACT

A lithographic apparatus uses the control signal from a computer to drive two spatial light modulators to pattern two separate projection beams for projection onto two substrates.

8 Claims, 1 Drawing Sheet

LITHOGRAPHIC APPARATUS AND DEVICE MANUFACTURING METHOD

RELATED APPLICATIONS

This application claims the benefit of priority to European Patent Application No. 02254089.2, filed Jun. 12, 2002, the contents of which are herein incorporated by reference.

BACKGROUND OF THE INVENTION

1. Field of the Invention

The present invention relates generally to a lithographic projection apparatus and more particularly to a lithographic projection apparatus including two projection beams.

2. Description of the Related Art

Lithographic projection apparatus are used in the manufacture of integrated circuits (ICs), flat panel displays and other devices involving fine structures. The programmable patterning means generates a pattern corresponding to an individual layer of, for example, the IC, and this pattern is imaged onto a target portion (e.g. comprising part of, one or several dies) on a substrate (e.g. silicon wafer or glass plate) that has been coated with a layer of radiation-sensitive material (resist).

Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. These transfer procedures result in a patterned layer of resist on the substrate. One or more pattern steps, such as deposition, etching, ion-implantation (doping), metallization, oxidation, chemo-mechanical polishing, etc., follow, each of which is intended to finish, create or modify a layer of the device. If several layers are required, then the whole procedure, or a variant thereof, is repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

A complete substrate may have of the order of $3 \times 10^{13}$ pixels over its full area. To achieve an exposure throughput of about 5 wafers per hour using a programmable patterning means with about 30 to $40 \times 10^6$ pixels requires that the programmable patterning means be refreshed with new data approximately every 250 microseconds taking account of the time required for exposure and dead time, i.e. at a rate of 4 kHz. Given that each pixel requires a byte of data, the data must be transferred at a rate of about $4 \times 10^{12}$ bits per second. To calculate this data from a file representing the mask pattern at the necessary rate is a difficult problem and requires a high speed, and therefore an expensive, computer.

SUMMARY OF THE INVENTION

It is an object of the present invention to provide a lithographic projection apparatus using a programmable patterning means which has improved throughput.

This and other objects are achieved according to the invention in a lithographic apparatus including a second programmable patterning means serving to pattern a second projection beam of radiation according to said desired pattern, a second substrate table for holding a second substrate; and a second projection system for projecting the second patterned beam onto a target portion of the second substrate;

wherein said control system also provides said control signal to set said second programmable patterning means according to said desired pattern.

The use of a second programmable patterning means, set to have the same pattern by using the same data as the first programmable patterning means, to expose a second substrate, substantially doubles the throughput of the lithographic projection apparatus. This, in turn, improves the cost effectiveness of the apparatus. Present apparatus with two substrate tables have two stable positions which, according to this invention, can both be used for exposing substrates.

In order to provide adequate signal control for each of the patterning means, a local calibration unit may be used with each of the programmable patterning means. These units apply a local correction to the signal provided by the control means to ensure the correct response from both programmable patterning means. The two local calibration units can also be considered together to be "a calibration unit."

A single radiation system may be used, its projection beam of radiation being split to provide two beams, each patterned by one of the programmable patterning means. Advantageously, this reduces the cost of the lithographic projection apparatus. Alternatively, two radiation systems may be provided, one with each of the programmable patterning means. The capital cost of this apparatus would be greater but the beam intensity of each patterned beam would be greater than apparatus in which the beam of a single radiation system is split, thereby reducing the required exposure time and hence increasing the throughput of the apparatus.

The first and second substrate tables, first and second programmable pattern means and the first and second projection systems may be mounted on a common base frame, essentially creating a single unified apparatus. Alternatively, the first substrate table, the first programmable patterning means and the first projection system may be mounted on a first base frame with the second substrate table, the second programmable pattern means and the second projection system mounted on a second, separate, base frame. The latter arrangement effectively provides two separate apparatus reducing the risk of one part generating disturbances with affect the accuracy of the second part.

According to a further aspect of the invention there is provided a device manufacturing method comprising the steps of:

providing a first substrate;

providing a first projection beam of radiation using a radiation system;

generating a control signal using a control system, said control signal used to generate a desired pattern in a first programmable patterning means;

using said first programmable patterning means to pattern the first projection beam; and projecting the first patterned beam of radiation onto a target portion of the first substrate;

characterized by:

providing a second substrate;

using said control signal to generate said desired pattern in a second programmable patterning means;

using said second programmable patterning means to pattern a second projection beam; and projecting said second patterned beam onto a target portion of said second substrate.

According to a yet further aspect of the invention there is provided a computer program for controlling a lithographic projection apparatus, comprising code means for instructing the apparatus to perform the following steps:

generate a control signal used to generate a desired pattern in a first programmable patterning means;

using said first programmable patterning means to pattern a first projection beam; and projecting the first patterned beam onto target portion of a substrate; characterized in that said computer program further comprises code means for instructing the apparatus to perform the following steps:

using said control signal to generate said desired pattern in a second programmable patterning means;

using said second programmable patterning means to pattern a second projection beam; and projecting said second patterned beam onto a target portion of said second substrate.

The term "programmable patterning means" or "patterning structure" as here employed should be broadly interpreted as referring to any means that can be used to endow an incoming radiation beam with a patterned cross-section, so that a desired pattern can be created in a target portion of the substrate; the terms "light valve" and "Spatial Light Modulator" (SLM) can also be used in this context. Examples of such patterning means include:

A programmable mirror array. This may comprise a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate spatial filter, the said undiffracted light can be filtered out of the reflected beam, leaving only the diffracted light to reach the substrate; in this manner, the beam becomes patterned according to the addressing pattern of the matrix-addressable surface. An array of grating light valves (GLV) can also be used in a corresponding manner. Each GLV is comprised of a plurality of reflective ribbons that can be deformed relative to one another to form a grating that reflects incident light as diffracted light. A further alternative embodiment of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described hereabove, the programmable patterning means can comprise one or more programmable mirror arrays. More information on mirror arrays as here referred to can be gleaned, for example, from U.S. Pat. Nos. 5,296,891 and 5,523,193, and PCT patent applications WO 98/38597 and WO 98/33096, which are incorporated herein by reference.

A programmable LCD array. An example of such a construction is given in U.S. Pat. No. 5,229,872, which is incorporated herein by reference.

It should be appreciated that where pre-biasing of features, optical proximity correction features, phase variation techniques and multiple exposure techniques are used, the pattern "displayed" on the programmable patterning means may differ substantially from the pattern eventually transferred to a layer of or on the substrate.

For the sake of simplicity, the projection system may be referred to as the "lens"; however, this term should be broadly interpreted as encompassing various types of projection system, including refractive optics, reflective optics, catadioptric systems and micro lens arrays, for example. It is to be understood that the term "projection system" as used in this application simply refers to any system for transferring the patterned beam from the programmable patterning means to the substrate. The radiation system may also include components operating according to any of these design types for directing, shaping or controlling the projection beam of radiation, and such components may also be referred to below, collectively or singularly, as a "lens". It has been proposed to fill a space between the final element of the projection system and the substrate with a liquid that has a refractive index of greater than one. This enables imaging of smaller features because the exposure radiation will have a shorter wavelength in liquid. The present invention may be used with apparatus of this type. Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and WO 98/40791, incorporated herein by reference.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, thin film transistor liquid crystal displays, printed circuit boards (PCBs), etc.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm), as well as particle beams, such as ion beams or electron beams.

BRIEF DESCRIPTION OF THE DRAWINGS

Exemplary embodiments of the invention will now be described, by way of example only, with reference to the accompanying schematic drawings, in which.

In the Figures, corresponding reference symbols indicate corresponding parts.

DETAILED DESCRIPTION

Embodiment 1

Figure 1:
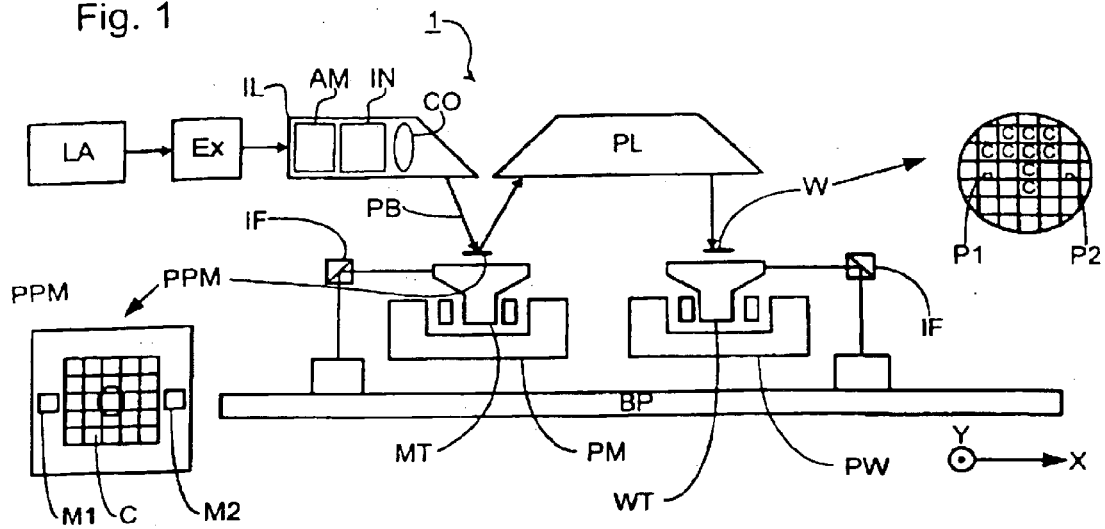
FIG. 1 depicts a lithographic projection apparatus according to an embodiment of the invention.

FIG. 1 schematically depicts a lithographic projection apparatus according to a particular embodiment of the invention. The apparatus comprises:

a radiation system Ex, IL, for supplying a projection beam PB of radiation (e.g. UV radiation), which in this particular case also comprises a radiation source LA;

a programmable patterning means PPM (e.g. a programmable mirror array) for applying a pattern to the projection beam; in general the position of the programmable patterning means will be fixed relative to item PL; however it may instead be connected to a positioning means for accurately positioning it with respect to item PL;

an object table (substrate table) WT provided with a substrate holder for holding a substrate W (e.g. a resist-coated silicon wafer), and connected to positioning means for accurately positioning the substrate with respect to item PL;

a projection system ("lens") PL (e.g. a quartz and/or $CaF_2$ lens system or a catadioptric system comprising lens elements made from such materials, or a mirror system) for projecting the patterned beam onto a target portion C (e.g. comprising one or more dies) of the substrate W; the projection system may project an image of the programmable patterning means onto the substrate; alternatively, the projection system may project images of secondary sources for which the elements of the programmable patterning means act as shutters; the projection system may also comprise a micro lens array (known as an MLA), e.g. to form the secondary sources and to project microspots onto the substrate.

As here depicted, the apparatus is of a reflective type (i.e. has a reflective programmable patterning means). However, in general, it may also be of a transmissive type, for example (i.e. with a transmissive programmable patterning means).

The source LA (e.g. an excimer laser) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the programmable patterning means PPM has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and Claims encompass both of these scenarios.

The beam PB subsequently intercepts the programmable patterning means PPM. Having been reflected by the programmable patterning means PPM, the beam PB passes through the projection system PL, which focuses the beam PB onto a target portion C of the substrate W. With the aid of the positioning means (and interferometric measuring means IF), the substrate table WT can be moved accurately, e.g. so as to position different target portions C in the path of the beam PB. Where used, the positioning means for the programmable patterning means can be used to accurately correct the position of the programmable patterning means PPM with respect to the path of the beam PB, e.g. during a scan. In general, movement of the object table WT is realized with the aid of a long-stroke module (course positioning) and a short-stroke module (fine positioning), which are not explicitly depicted in FIG. 1. A similar system may also be used to position the programmable patterning means. It will be appreciated that the projection beam may alternatively/additionally be moveable while the object table and/or, the programmable patterning means may have a fixed position to provide the required relative movement.

Although the lithography apparatus according to the invention is herein described as being for exposing a resist on a substrate, it will be appreciated that the invention is not limited to this use and the apparatus may be used to project a patterned projection beam for use in resistless lithography.

The depicted apparatus can be used in four preferred modes:

1. Step mode: the entire pattern on the programmable patterning means is projected in one go (i.e. a single "flash") onto a target portion C. The substrate table WT is then moved in the x and/or y directions to a different position for a different target portion C to be irradiated by the beam PB.

2. Scan mode: essentially the same as step mode, except that a given target portion C is not exposed in a single "flash". Instead, the programmable patterning means is movable in a given direction (the so-called "scan direction", e.g. the y direction) with a speed v, so that the projection beam PB is caused to scan over the programmable patterning means; concurrently, the substrate table WT is simultaneously moved in the same or opposite direction at a speed V=Mv, in which M is the magnification of the lens PL. In this manner, a relatively large target portion C can be exposed, without having to compromise on resolution.

3. Pulse mode: the programmable patterning means is kept essentially stationary and the entire pattern is projected onto a target portion C of the substrate using a pulsed radiation source. The substrate table WT is moved with an essentially constant speed such that the projection beam PB is caused to scan a line across the substrate W. The pattern on the programmable patterning means is updated as required between pulses of the radiation system and the pulses are timed such that successive target portions C are exposed at the required locations on the substrate. Consequently, the projection beam can scan across the substrate W to expose the complete pattern for a strip of the substrate. The process is repeated until the complete substrate has been exposed line by line.

4. Continuous scan mode: essentially the same as pulse mode except that a substantially constant radiation source is used and the pattern on the programmable patterning means is updated as the projection beam scans across the substrate and exposes it.

Combinations and/or variations on the above described modes of use or entirely different modes of use may also be employed.

Figure 2:
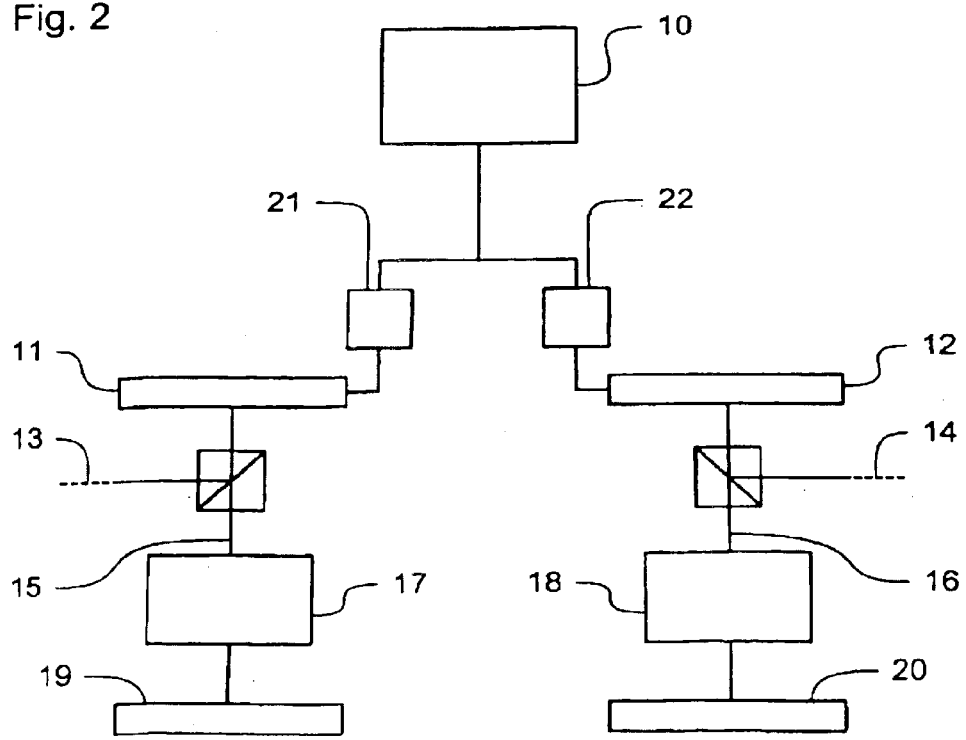
FIG. 2 depicts a section of the lithographic projection apparatus according to the present invention.

FIG. 2 shows a section of the lithographic projection apparatus of the invention. A computer 10 generates the data to generate a pattern on a spatial light modulator 11 or other programmable patterning means. The same data is also used to generate a pattern on a second spatial light modulator 12 or other programmable patterning means. The patterns on the spatial light modulators 11 and 12 are used to pattern projection beams 13, 14 to produce patterned projection beams 15, 16. The patterned projection beams are projected using projection optics 17, 18 onto substrates 19, 20, respectively. In this way data from a single computer 10 is used to drive the spatial light modulators to selectively expose two substrates.

In order to ensure that both spatial light modulators 11, 12 respond correctly to the control signals from the computer 10, the control signal is sent to first and second local calibration units 21, 22 before being provided to the first and second spatial light modulators 11, 12, respectively. The calibration units 21, 22 are used to adjust the signal such that the signal maxima and minima are at the required level and to provide the correct gray levels in between.

The local calibration units 21,22 may include a look-up table that contain any necessary correction for each pixel in the spatial light modulator. The corrections are applied to the pixel data generated by the computer 10 to produce the necessary input for setting the mirrors in the spatial light modulator to produce the correct gray level.

In an alternative embodiment the master file that the computer 10 uses to generate the pixel data for the spatial light modulators is amended such that no local calibration is required for one of the spatial light modulators and the local calibration unit for the other of the spatial light modulators compensates for this.

A single radiation source may be used to produce both projection beams 13, 14. For instance, the projection beam from the radiation system may be transmitted through a beam splitter to produce the two radiation beams 13, 14. However, each radiation beam 13, 14 will have approximately half the intensity of the original radiation beam. In consequence the exposure time will be increased for a given radiation source. In an alternative arrangement of the present invention, the apparatus comprises two radiation systems, the first producing a beam of radiation 13 to be patterned by the first spatial light modulator 11 and the second producing a second beam of radiation 14 to be patterned by the second spatial light modulator 12.

The present invention may also comprise further spatial light modulators for patterning projection beams which are also provided with the same control signal from the computer 10. For example, the signal from the computer 10 may be provided to the spatial light modulator(s) in another lithographic projection apparatus.

The first and second substrate tables, the first and second projection systems and the first and second programmable pattern means may be mounted on a common base frame that is isolated from vibrations from the ground. Thus, the apparatus effectively forms a single unit. The radiation system and, where applicable, the second radiation system, may also be mounted on the common base frame. Alternatively, the apparatus may be split into two separate units, the first substrate table, the first programmable patterning means and the first projection system mounted on a first base frame and the second substrate table, the second programmable pattern means and the second projection system mounted on a second, separate, base frame. Thus, the apparatus is effectively split into two separate sub-units, minimizing any disturbance, such as vibrations, of one on the other. As before, the radiation system, or radiation systems, if applicable, may be mounted on one or both of the first and second base frames. As a further alternative, the first and second sub-units may have essentially separate base frames but share a common frame for one or more of the elements of the apparatus, such as the projection systems.

It is to be appreciated that the extent to which the control system is shared between the first and second sub-units of the apparatus (containing the first and second programmable patterning means, respectively) will vary. For example, the control system may receive pattern data corresponding to the desired pattern and convert this into drive signals that are used directly to set the first and second programmable pattern means. Alternatively, the control system may provide the pattern data to each of the programmable patterning means which will individually convert the pattern data into drive signals for setting the programmable patterning means. In the latter situation, the control system may provide the pattern data for the complete pattern to be produced on the substrate, in which case the programmable patterning means will also break the pattern data down in the individual sections to be produced at each instant on each programmable patterning means, or the control system may break the pattern data down and only provide the relevant portion of the pattern data at each instant to each of the programmable pattern means. In this regard, the control system may comprise separate controllers for each programmable patterning means.

It is also to be appreciated that, while the invention has been described above in terms of a first and second programmable patterning means for exposing first and second substrates the invention is not intended to be limited to this and a plurality of programmable patterning means may be used to expose a plurality of substrates in a corresponding manner.

Whilst specific embodiments of the invention have been described above, it will be appreciated that the invention may be practiced otherwise than as described. The description is not intended to limit the invention.

What is claimed is:

1. A lithographic projection apparatus comprising:
    a radiation system to provide a first projection beam of radiation;
    a programmable patterning structure to pattern the first projection beam according to a desired pattern;
    a first substrate table to hold a first substrate;
    a first projection system to project the first patterned beam onto a target portion of the first substrate;
    a control system to provide a control signal to set the first programmable patterning structure according to said desired pattern;
    a second programmable patterning structure to pattern a second projection beam of radiation according to said desired pattern;
    a second substrate table to hold a second substrate; and
    a second projection system for projecting the second patterned beam onto a target portion of the second substrate,
    wherein said control system also provides a control signal to set said second programmable patterning structure according to said desired pattern.

2. A lithographic projection apparatus according to claim 1, wherein said apparatus further comprises a calibration unit constructed and arranged to allow for adjustment of the control signal input to the first programmable patterning structure, and the control signal input to the second programmable patterning structure.

3. A lithographic projection apparatus according to claim 1, wherein said radiation system is constructed and arranged to provide said second projection beam.

4. A lithographic projection apparatus according to claim 1, wherein said apparatus further comprises a second radiation system to provide said second projection beam.

5. A lithographic projection apparatus according to any claim 1, wherein said first substrate table, said first programmable patterning structure, said first projection system, said second substrate table, said second programmable patterning structure and said second projection system are mounted on a common base frame.

6. A lithographic projection apparatus according to claim 1, wherein said first substrate table, said first programmable patterning structure and said first projection system are mounted on a first base frame and said second substrate table, said second programmable patterning structure and said second projection system are mounted on a second, separate, base frame.

7. A device manufacturing method comprising:

generating a control signal using a control system, said control signal used to generate a desired pattern in a first programmable patterning structure;

projecting a first patterned beam of radiation having the desired pattern from the first programmable patterning structure onto a target portion of a first substrate;

using said control signal to generate the desired pattern in a second programmable patterning structure; and projecting a second patterned beam having the desired pattern from the second programmable patterning structure onto a target portion of a second substrate.

8. A machine readable medium including machine executable instructions for controlling a lithographic projection apparatus according to a method comprising:

generating a control signal used to generate a desired pattern in a first programmable patterning structure;

using said first programmable patterning structure to pattern a first projection beam;

projecting the first patterned beam onto a target portion of a first substrate;

using said control signal to generate said desired pattern in a second programmable patterning structure;

using said second programmable patterning structure to pattern a second projection beam; and projecting said second patterned beam onto a target portion of a second substrate.

* * * * *